(12) United States Patent
Kirkpatrick et al.

(10) Patent No.: US 7,732,284 B1
(45) Date of Patent: Jun. 8, 2010

(54) POST HIGH-K DIELECTRIC/METAL GATE CLEAN

(75) Inventors: Brian K. Kirkpatrick, Allen, TX (US); Jinhan Choi, Frisco, TX (US); Deborah J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/344,421

(22) Filed: Dec. 26, 2008

(51) Int. Cl.
*H01L 21/00* (2006.01)

(52) U.S. Cl. .................. 438/287; 438/585; 438/754; 438/906

(58) Field of Classification Search ............... 438/287, 438/585, 754, 906
See application file for complete search history.

(56) References Cited

U.S. PATENT DOCUMENTS

| 6,727,187 B2 * | 4/2004 | Takeshima et al. .......... 438/745 |
| 7,186,657 B2 * | 3/2007 | Hwang et al. .............. 438/705 |
| 7,192,878 B2 * | 3/2007 | Weng et al. ................ 438/734 |
| 2005/0176604 A1 | 8/2005 | Lee et al. |

* cited by examiner

*Primary Examiner*—Richard A. Booth
(74) *Attorney, Agent, or Firm*—Wade J. Brady, III; Frederick J. Telecky, Jr.

(57) ABSTRACT

A method for fabricating a CMOS integrated circuit (IC) includes the step of providing a substrate having a semiconductor surface. A gate stack including a metal gate electrode on a metal including high-k dielectric layer is formed on the semiconductor surface. Dry etching is used to pattern the gate stack to define a patterned gate electrode stack having exposed sidewalls of the metal gate electrode. The dry etching forms post etch residuals some of which are deposited on the substrate. The substrate including the patterned gate electrode stack is exposed to a solution cleaning sequence including a first clean step including a first acid and a fluoride for removing at least a portion of the post etch residuals, wherein the first clean step has a high selectivity to avoid etching the exposed sidewalls of the metal gate electrode. A second clean after the first clean consists essentially of a fluoride which removes residual high-k material on the semiconductor surface.

17 Claims, 2 Drawing Sheets

POST HIGH-K DIELECTRIC/METAL GATE CLEAN

FIELD

The present invention relates to methods of forming integrated circuits (ICs) including MOS transistors, and more particularly to methods of forming ICs including metal gate and high-k dielectric comprising MOS transistors.

BACKGROUND

The gate stack has historically been manufactured from polysilicon on a silicon dioxide or nitrided silicon oxide (SiON) gate dielectric. This gate stack is generally defined by a plasma etch process, which is known to generate post etch residuals. Following plasma etching to form the gate stack, a post gate etch clean is generally performed to remove the post etch residuals.

A conventional post gate etch clean chemistry for such a gate stack comprises sulfuric acid ($H_2SO_4$)/hydrogen peroxide ($H_2O_2$)+DI water Rinse+ammonium hydroxide and hydrogen peroxide (known as SC-1)+a DI water Rinse. Whatever gate electrode materials are not etched by the $H_2SO_4/H_2O_2$ treatment are generally etched by the SC-1 solution.

Recently, polysilicon has been replaced with metal and the silicon dioxide or SiON gate dielectric with a high-k dielectric material to improve transistor performance. For example, the metal gate electrode being a true electrical conductor suppresses the gate depletion layer of a MOS transistor. This changes the gate electrode/gate dielectric interface to metal on a high-k dielectric and introduces material compatibility issues that generally prevents using the conventional post gate etch clean chemistry described above.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

The Present Inventors have discovered dry etch processing of a metal comprising gate stack results in the formation of new dry etch generated residual materials, including certain residues that are generally based on the etch mask material (e.g. photoresist or spin on glass), wherein the residue(s) typically include species such as O, C, Si, and amines. Such residues are herein referred to as "post etch residues". In addition, the Present Inventors have discovered that known post gate etch cleans generally result in significant undercutting of the metal comprising gate electrode(s) and the barrier metal(s), and are generally ineffective at removing substantially all the high-k dielectric on the semiconductor surface. Residual high-k dielectric on the semiconductor surface has been discovered to generally be in the form of "high-k metal/semiconductor assemblies" that can form during the high-k dielectric anneal (e.g. 900 to 1,000° C.) which generally follows after high-k dielectric deposition. In the case of a Hf comprising dielectric and a silicon surface, the high-k metal/semiconductor assemblies can comprise Hf and Si.

In their search for a post high-k dielectric/metal gate clean that is suitable for a dry etched gate stack comprising a metal gate material and a high-k dielectric, the Present Inventors have discovered new multi-step wet etch methods for removing dry etch generated residues following dry (e.g. plasma) etching a gate stack comprising a metal comprising gate electrode and the high-k gate dielectric. The now multi-step wet etch methods have been found to be capable of removing high-k metal/semiconductor assemblies which may be present on the semiconductor surface after the day etch. Embodiments of the invention also generally result in little or no undercutting of metal gate electrode or the barrier metal.

In one embodiment of the invention, a method for fabricating a CMOS integrated IC comprises providing a substrate (e.g. water) having a semiconductor surface, and forming a gate stack comprising a metal gate electrode on a metal comprising high-k dielectric layer on the semiconductor surface. Dry etching, such as plasma etching, is used to pattern the gate stack to define a patterned gate stack having exposed metal gate electrode sidewalls, wherein the dry etching forms post etch residuals which can deposit on the gate sidewalls. The substrate including the patterned gate electrode stack is then exposed to a solution cleaning sequence comprising a first clean step and a second clean step. The first clean step comprises a first acid and a fluoride for removing at least a portion of the post etch residuals and at least a portion of the high-k dielectric on the semiconductor surface. The first acid comprises an acid that does not appreciably etch metals, such as sulfuric acid or phosphoric acid. The first clean step has a high selectivity to avoid etching the exposed sidewalls of the gate electrode stack. As used herein, "high selectivity" for the first clean step refers to a post etch residual (s) to gate electrode stack etch selectivity of $\geq 50$. A second clean follows after the first clean and consists essentially of a fluoride which is operable to remove residuals from the high-k dielectric layer on the semiconductor surface, such as in the form of high-k metal/semiconductor assemblies on the semiconductor surface.

DETAILED DESCRIPTION

Figure 1:
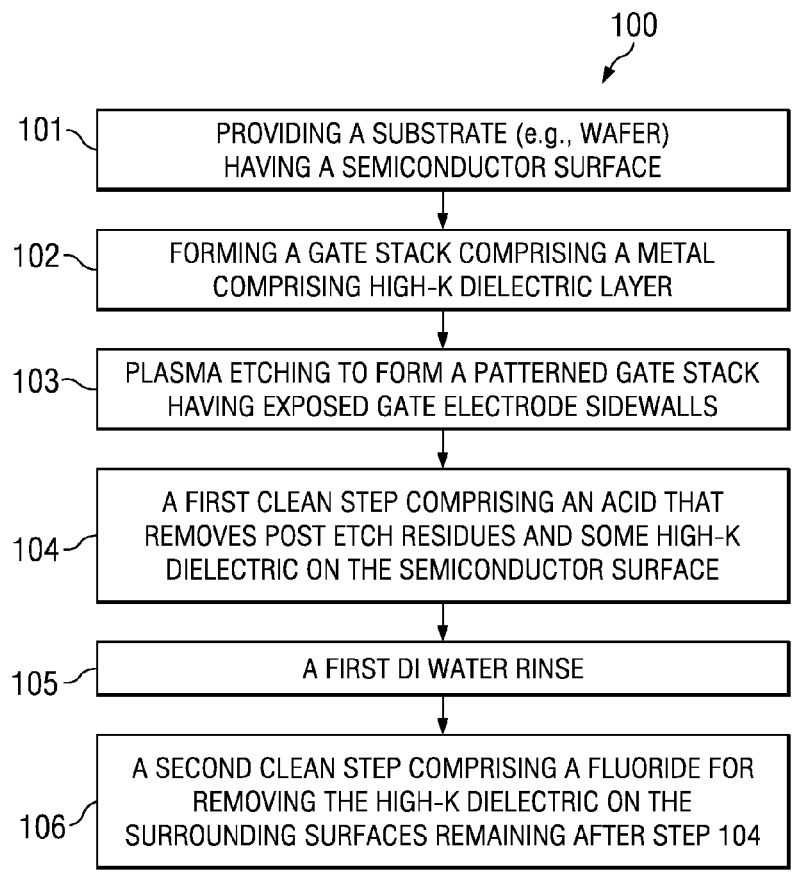
FIG. 1 shows a flow diagram for a first method for fabricating CMOS ICs comprising devices having metal gate electrodes and high-k dielectrics including wet etch processing for removing dry gate etch generated residuals including post etch residues and high-k dielectric comprising materials on the semiconductor surface, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows a flow diagram for a first method 100 for fabricating CMOS ICs comprising devices having metal gate electrodes and high-k dielectrics including wet etch processing for removing dry gate etch generated residuals including post etch residues and high-k dielectric comprising materials on the semiconductor surface, according to an embodiment of the invention. Step 101 comprises providing a substrate (e.g. wafer) having a semiconductor surface, such as a Si or a Ge surface. Step 102 comprises forming a gate stack comprising a metal comprising high-k dielectric layer on the semiconductor surface and at least one metal comprising gate electrode layer on the gate dielectric layer. The gate dielectric layer can comprise a metal comprising high-k dielectric layer, such as hafnium oxide, hafnium silicon oxide, hafnium silicon oxynitride, lanthanum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. The gate dielectric can comprise both Hf and Zr. In one particular embodiment the gate dielectric is a Hf comprising gate dielectric layer that comprises 1 nm to 5 nm of HfSiON, wherein the HfSiON comprises 30 to 60 at. % $SiO_2$ and 2 to 20 at % $N_2$. HfSiON can be formed by nitridizing HfSiO.

The gate electrode layer can comprise at least one refractory metal. As known in the art, the five refractory metals comprise Tungsten (W), Molybdenum (Mo), Niobium (Nb), Tantalum (Ta), and Rhenium (Re). In one particular embodiment the gate electrode layer comprises W and the barrier layer on the W layer comprises TaN. Polysilicon can be on top of the barrier layer to complete the gate electrode stack.

In step 103, the gate stack is patterned generally using plasma etching to define a patterned gate stack having exposed gate electrode sidewalls. The high-k dielectric generally remains substantially intact (near its deposited thickness, e.g. 1.5 to 3 nm) both under the gate stack and on the silicon surface lateral to the gate stack. The exposed gate electrode sidewalls generally include at least one refractory metal, such as W or Ta. As described above, the plasma etch process generally results in the formation of post-etch residuals, including post etch residues as described above which can deposit on the gate sidewalls.

In step 104, the substrate including the patterned gate electrode is exposed to a first clean step comprising and acid that substantially removes the post etch residues and etches the high-k dielectric generally sufficiently to result in the formation of a discontinuous layer having isolated patches of high-k dielectric material. The first clean step has sufficient selectivity to not measurably etch the gate electrode materials exposed on the sidewalls of the gate stack. The acid for the first clean can comprise acids that do not appreciably etch metals, such as sulfuric acid and phosphoric acid. The first clean generally also includes a fluoride. The chemistry for the first clean step is generally exclusive of peroxides, such as hydrogen peroxide. The first clean step is generally performed at a temperature of at least 40° C., such as in a temperature range of 60° C. to 120° C.

Step 105 follows the first clean and comprise a first DI water rinse. The DI water clean can comprise megasonic agitation for at least a portion of its time.

Step 106 comprises a second clean step. The second clean consists essentially of a fluoride, generally being a dilute fluoride solution, such as a 100:1 HF solution (volumes herein all expressed as concentrated solutions, unless noted otherwise). A function for the second clean step includes removing the high-k dielectric remaining after step 104, which as described above may include high-k dielectric in the form of high-k metal/semiconductor assemblies on the semiconductor surface, such as Hf/Si assemblies in the case of a Hf comprising dielectric and a silicon surface. Such assemblies, if not removed, can act as implant masks for subsequent source/drain implants.

The fluoride for the first clean step and second clean step are independently selectable from the group consisting of hydrogen fluoride (HF), ammonium fluoride, tetramethylammonium fluoride, ammonium hydrogen fluoride, fluorboric acid and tetramethylammonium tetrafluoroborate.

In one particular embodiment of the invention the fluoride in the first clean comprises HF and the first clean further comprises DI water, wherein a volume ratio of the sulfuric acid, DI water and HF is A:B:1 wherein A is between 200 and 800 (typically 400), B is between 2 and 50 (typically 15). In one particular embodiment of the invention the fluoride in the second clean comprises HF, and the second clean comprises HF diluted from 50 to 150:1 with DI water, at a temperature between 20 and 30° C.

Figure 2A:
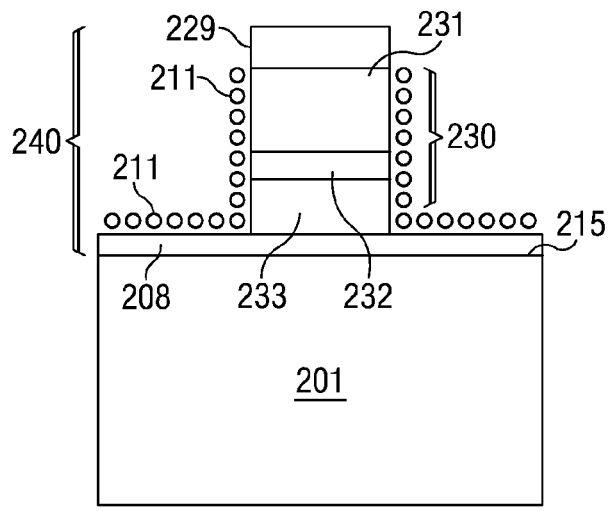
FIGS. 2A-C show a series of cross sectional depictions depicting cross sections after plasma etch of the gate stack, after the first wet clean step, and after the second wet clean step, respectively, according to an embodiment of the invention.
Figure 2B:
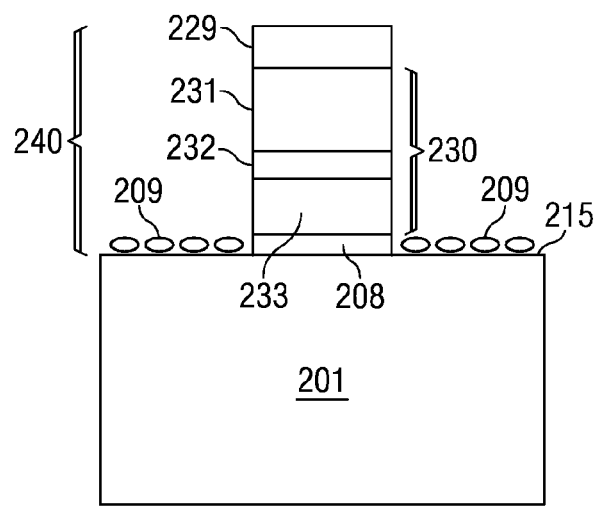
Figure 2C:
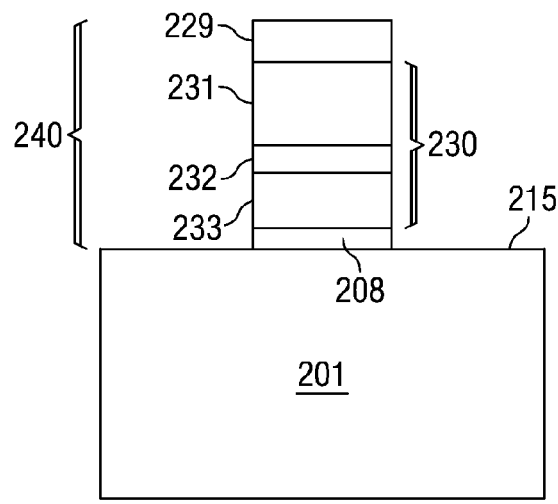

FIGS. 2A-C shows a series of cross sectional depictions depicting cross section after plasma etch of the gate stack, after the first wet clean step, and after the second wet clean step, respectively, according to an embodiment of the invention. FIG. 2A shows an exemplary cross sectional depiction after a plasma etch of a gate stack 240 comprising a patterned gate electrode stack 230 comprising filler layer 231 on barrier layer 232 on the gate electrode layer 233, on a high-k dielectric material 208 that is formed on a substrate 201. Inorganic anti-reflective coating (IARC) 229 is shown on the top of the gate stack 240. The high-k dielectric layer 208 is shown at the bottom of the gate stack 240 and on the semiconductor surface 215 lateral to the gate stack 240. Post etch residue particles 211 are shown on the sidewalls of the patterned gate electrode stack 230 and on the surface of one high-k dielectric layer 208.

FIG. 2B shows an exemplary cross sectional depiction after the first wet clean step. The post etch residue particles 211 that had been on the sidewalls of the patterned gate electrode stack 230 are shown removed by the first wet clean, while the high-k dielectric layer on the silicon surface is thinned to the point it becomes a discontinuous layer comprising a plurality of patches 209. There is no noticeable undercut of the gate stack 240 resulting from the first clean step.

FIG. 2C shows an exemplary cross sectional depiction after second wet clean step. The second wet clean step removes the residual high-k dielectric layer that had been shown as patches 209 in FIG. 2B, including high-k dielectric 209 that can be in the form of high-k metal/semiconductor assemblies. High-k metal/semiconductor assemblies can comprise HfSi comprising assemblies in the case of a Si surface or HfGe comprising assemblies in the case of a Ge surface. As with the first clean step, there is no noticeable undercut of the gate stack 240 resulting from the second clean step.

Figure 3:
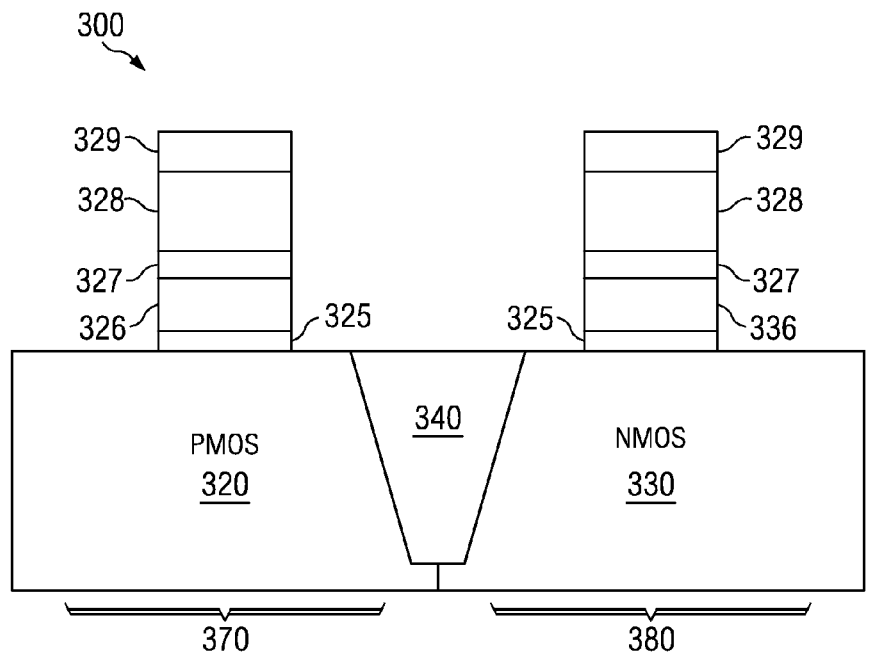
FIG. 3 shows a cross sectional depiction of an exemplary CMOS IC after post gate etch clean processing according to embodiments of the invention.

FIG. 3 shows a cross sectional depiction of an exemplary CMOS IC 300 after post gate etch clean processing according to an embodiment of the invention. Exemplary gate stacks are shown for both a PMOS device 370 formed in PMOS device region 320 and NMOS device 320 formed in NMOS device region 330. Isolation region 340 is provided. The gate stack for PMOS device 370 comprises inorganic anti-reflective coating (IARC) 329/polysilicon 328/barrier metal layer 327/ metal gate layer comprising a silicidable metal (e.g. W) 326/ high-k dielectric layer 325. Similarly, the gate stack for NMOS device 380 comprises IARC 329/polysilicon 328/ barrier metal layer 327/silicide gate layer (e.g. $WSi_2$) 336/ high-k dielectric layer 325.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

Wafers having the PMOS gate stack shown in FIG. 3 without barrier metal layer 327 shown therein were prepared. The gate stack was formed by plasma etching a gate stack comprising a 2 nm thick layer of HfSiON gate dielectric 325, a 10 nm thick W layer 326, a polysilicon layer 328 that was a 50 nm thick polysilicon layer, and a 30 nm thick IARC layer 329. Images were acquired and analyzed and particles counted using a KLA-2800 from KLA Instruments (KLA-Tencor Corporation, Milpitas, Calif. 95035) Metal levels for Hf were measured using TXRF and VPD-DC-ICPMS.

The post plasma etch solution cleaning sequence comprised a first clean step comprising sulfuric acid:DI water:HF, a rinse, then a second clean step that comprised a 15 seconds dilute (100:1) HF, a rinse, and 5 minutes DI water with megasonic agitation. A ratio of sulfuric acid, DI water and HF was A:B:1 where A was between 400 and 800 and B was 0. The images obtained evidence a clean post gate etch surface without noticeable undercut of the gate stack films exposed including HFSiON, W, WSix and TaN. The concentration of Hf on the silicon surface was found to be consistently $<1\times10^{10}$ atoms/cm$^2$, typically around the VPD-DC-ICPMS detection level of about $4.8\times10^7$/cm$^2$ for Hf.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for fabricating a CMOS integrated circuit (IC), comprising:
   providing a substrate having a semiconductor surface;
   forming a gate stack comprising a metal gate electrode on a metal comprising high-k dielectric layer on said semiconductor surface;
   dry etching to pattern said gate stack to define a patterned gate electrode stack having exposed sidewalls of said metal gate electrode, said dry etching forming post etch residuals; and
   exposing said substrate including said patterned gate electrode stack to a solution cleaning sequence comprising:
   a first clean step comprising a first acid and a fluoride for removing at least a portion of said post etch residuals, said first clean step having a high selectivity to avoid etching said exposed sidewalls of said metal gate electrode, and
   a second clean after said first clean consisting essentially of a fluoride, wherein said second clean removes residuals from said high-k dielectric layer on said semiconductor surface.

2. The method of claim 1, wherein said dry etching comprises plasma etching.

3. The method of claim 1, wherein said first acid comprises sulfuric acid or phosphoric acid.

4. The method of claim 1, wherein said first clean step is exclusive of peroxides.

5. The method of claim 1, wherein said first clean is performed at a temperature of at least 40° C.

6. The method of claim 5, wherein said temperature is between 60° C. and 120° C.

7. The method of claim 1, wherein said metal gate electrode comprises at least one refractory metal.

8. The method of claim 7, wherein said refractory metal comprises W or Ta.

9. The method of claim 1, wherein said fluoride for said first clean step and said second clean step are independently selectable from the group consisting of hydrogen fluoride, ammonium fluoride, tetramethylammonium fluoride, ammonium hydrogen fluoride, fluorboric acid and tetramethylammonium tetrafluoroborate.

10. The method of claim 1, further comprising a first DI water rinse between said first clean step and said second clean step and a second DI water rinse after said second clean step, wherein said first DI water rinse and said second DI water clean step comprises megasonic agitation for at least a portion of their respective times.

11. The method of claim 1, wherein said high-k dielectric material comprises hafnium oxide, hafnium silicon oxide, hafnium silicon oxynitride, lanthanum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

12. The method of claim 1, wherein said first acid comprises sulfuric acid and said fluoride and in said first clean step comprises HF, said first clean step further comprising DI water, wherein a ratio of said sulfuric acid, DI water and said HF is A:B:1 wherein A is between 200 and 800, and B is between 2 and 50.

13. The method of claim 1, wherein said wherein said fluoride in said second clean step comprises HF, wherein said second clean step comprises said HF diluted from 50 to 150:1 with DI water, at a temperature of 20 to 30° C.

14. A method for fabricating a CMOS integrated circuit (IC), comprising:
providing a substrate having a silicon surface;
forming a gate stack comprising a refractory metal gate electrode on a Hf comprising high-k dielectric layer on said silicon surface;
plasma etching to pattern said gate stack to define a patterned gate stack having exposed sidewalls of said metal gate electrode, said dry etching forming post etch residuals; and
exposing said substrate including said patterned gate stack to a solution cleaning sequence comprising:
a first clean step comprising sulfuric acid and a fluoride for removing at least a portion of said post etch residuals, having a high selectivity to said exposed sidewalls of said metal gate electrode, and
a second clean after said first clean consisting essentially of a fluoride.

15. The method of claim 14, wherein said fluoride and in said first clean step comprises HF and said first clean step further comprises DI water, wherein a ratio of said sulfuric acid, DI water and said HF is A:B:1 wherein A is between 200 and 800, and B is between 2 and 50.

16. The method of claim 14, wherein said refractory metal gate electrode comprises W.

17. The method of claim 16, wherein said CMOS circuit comprises at least one PMOS device and at least one NMOS device, wherein said refractory metal gate electrode comprises W metal for said PMOS device and $WSi_2$ for said NMOS device.

* * * * *